United States Patent [19]

King et al.

[11] Patent Number: 4,884,039
[45] Date of Patent: Nov. 28, 1989

[54] DIFFERENTIAL AMPLIFIER WITH LOW NOISE OFFSET COMPENSATION

[75] Inventors: Lawrence A. King, Grapevine; Peter J. Andrews, Richardson, both of Tex.

[73] Assignee: Texas Instruments Incorporated, Dallas, Tex.

[21] Appl. No.: 242,451

[22] Filed: Sep. 9, 1988

[51] Int. Cl.$^4$ .............................................. H03F 3/45
[52] U.S. Cl. ...................................... 330/253; 330/9
[58] Field of Search ................... 330/9, 252, 253, 257, 330/258, 261, 277

[56] References Cited

U.S. PATENT DOCUMENTS

| | | | |
|---|---|---|---|
| 4,004,245 | 1/1977 | Ochi et al. | 330/253 |
| 4,423,385 | 12/1983 | Evans | 330/253 X |
| 4,622,521 | 11/1986 | Redfern | 330/9 |
| 4,707,667 | 11/1987 | Bertsch | 330/9 |

OTHER PUBLICATIONS

Preliminary Data Sheet LTC 1050 Chopper Stabilized Operational Amplifier, Pub. by Linear Technology Corp., Mar. 1988.

Primary Examiner—Steven Mottola
Attorney, Agent, or Firm—B. Peter Barndt; James T. Comfort; Melvin Sharp

[57] ABSTRACT

A differential amplifier having input and output stages includes a linear offset operation circuit comprising sources providing a reference voltage and an offset correction voltage and a pair of transistors coupled for linear operation and responsive to the voltages for supplying differential related offset correction currents to the amplifier output stage for reducing offset characteristic of the amplifier stages and for reducing output noise and offset attributable to a noise component of the reference voltage source.

15 Claims, 1 Drawing Sheet

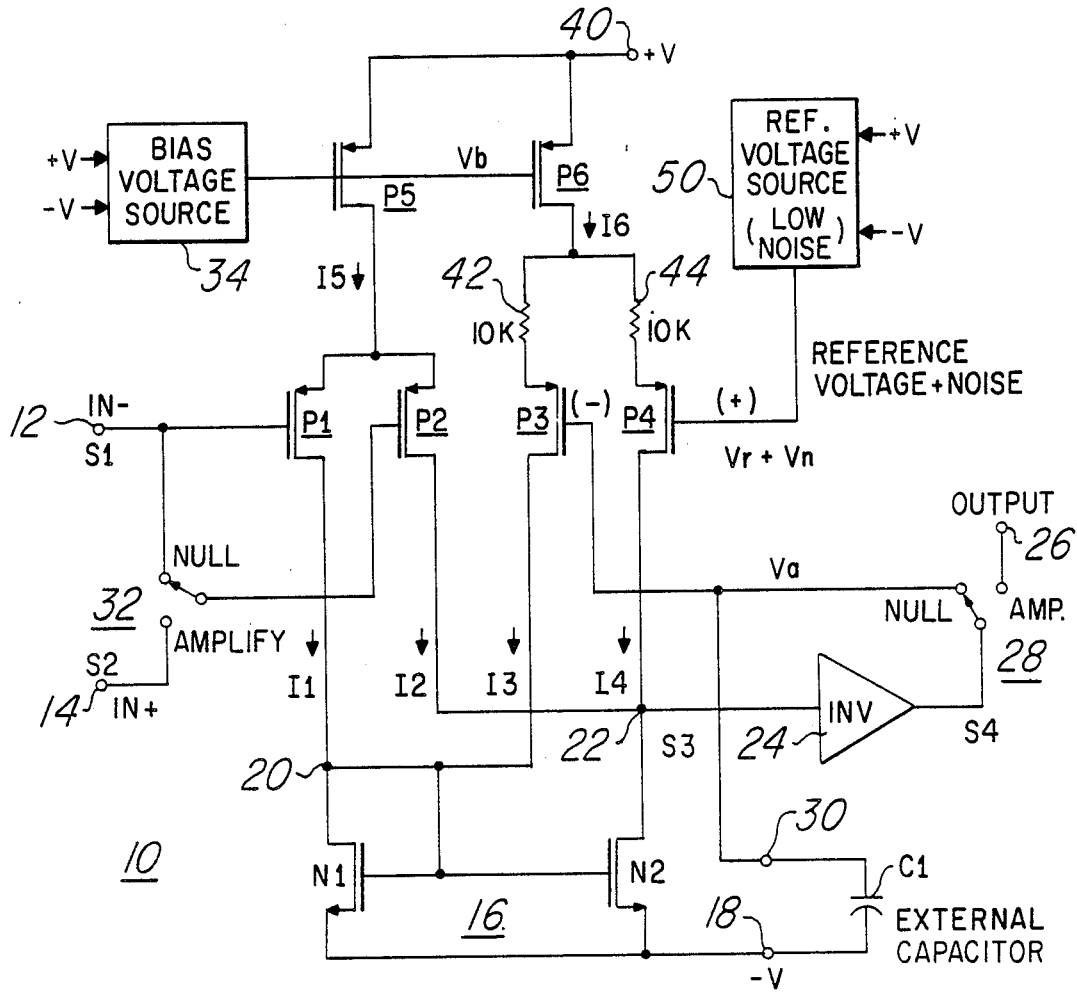

DIFFERENTIAL AMPLIFIER WITH LOW NOISE OFFSET COMPENSATION

FIELD OF THE INVENTION

This invention relates to amplifiers and particularly to differential amplifiers having compensation for offset errors.

BACKGROUND OF THE INVENTION

Offset errors which are subject to change with an operating parameter of an amplifier (e.g., temperature, supply voltage or signal level) may be corrected by use of so-called "chopper" stabilization techniques. In one form of chopper stabilized amplifier the offset is corrected by periodically sampling the amplifier offset with the amplifier input short circuited and using the sampled voltage as a correction signal during a following cycle when the input short circuit is removed.

An example of a chopper stabilized amplifier is described by Redfern in U.S. Pat. No. 4,622,521 which issued Nov. 11, 1986. In the Redfern amplifier a bias voltage is applied to the gate of a common source connected N-channel transistor that is connected in parallel with one load transistor of the amplifier. An offset correction voltage (produced and stored in a capacitor during the amplifier "null" cycle) is applied to the gate of another common source connected N-channel transistor that is coupled in parallel with the other load transistor of the amplifier. In such an arrangement, offset voltage is corrected (nulled) by variation of the load transconductance of one transistor of the amplifier.

SUMMARY OF THE INVENTION

In the aforementioned Redfern patent it is stated that the offset correction transistors have a small transconductance compared to the load transistors and it is concluded that they do not therefore contribute significant noise to the amplifier.

The present invention resides in part in the discovery that amplifiers of the type described (which employ common source connected offset correction transistors in parallel with load transistors of the amplifier) are, in fact, subject to both a noise problem and an uncorrectable offset problem and these problems have been found to be directly attributable to the manner of application of offset correction to the amplifier. Moreover, the suggested technique of merely reducing the transconductance of the correction transistors relative to the load transistors does not address the cause of the problems and undesirably reduces the overall offset correction range for the amplifier.

As discussed in more detail subsequently, it has been found that if the reference voltage supply contains a noise component, this component will be subject to rectification by the common-source connected correction transistor to which it is applied. This results because a common source connected correction transistor, having a square-law characteristic, provides greater conduction for one polarity of noise voltage than for the opposite polarity. An effect of such rectification is to produce an unbalanced noise current that will be manifested both as a noise voltage and a noise dependent offset at the amplifier output.

The present invention is directed to meeting the need for an amplifier having offset correction and in which the foregoing problem of noise voltage rectification is eliminated and the amplifier noise level and offset attributable to the offset correction reference voltage source of the amplifier is reduced.

A differential amplifier embodying the invention includes a pair of input transistors for receiving input signals to be amplified and for providing first and second output currents to a load circuit for developing an output signal representative of a difference between said input signals. A linear offset correction circuit is provided which includes sources for providing an offset correction voltage and a reference voltage and a pair of auxiliary transistors responsive to the voltages for supplying third and fourth differentially related output currents to respective inputs of the load circuit for correcting offset errors in said output signal.

In accordance with a further aspect of the invention, the input transistors and the auxiliary transistors are coupled to respective current sources and the current sources are controlled by a common bias voltage source.

In accordance with another aspect of the invention, the reference voltage source and the bias voltage source are selected to be independent sources, the reference voltage source having a lower noise component of output voltage than the bias voltage source.

BRIEF DESCRIPTION OF THE DRAWING

The foregoing and further features of the invention are illustrated in the sole FIGURE which is a circuit diagram, partially in block form, of a differential amplifier embodying the invention

DETAILED DESCRIPTION

The differential amplifier 10 of the sole FIGURE includes a pair of input terminals 12 and 14 for receiving respective ones of input signals S1 and S2 to be amplified with terminal 12 serving as the inverting input (IN−) of the amplifier and terminal 14 serving as the non-inverting (IN+) amplifier input. A pair of P-channel source-coupled input transistors P1 and P2 are provided having gate electrodes for receiving the input signals S1 and S2, respectively, and drain electrodes coupled to provide respective output currents I1 and I2 to a load circuit 16 for developing an output signal representative of a difference in the input signals S1 and S2.

Load circuit 16 comprises a pair of N-channel transistors connected as a unity gain current mirror amplifier to provide differential to single-ended current to voltage conversion of the currents I1 and I2. Transistors N1 and N2 have source electrodes connected to a negative supply voltage input terminal 18 for receiving an operating voltage −V and have drain electrodes connected to respective ones of circuit nodes 20 and 22 which comprise the current mirror amplifier input and output nodes or terminals. The gate electrodes of both mirror transistors N1 and N2 are connected to mirror input node 20 to which input current I1 is applied. The current I2 is applied to mirror output node 22 output node. Since the mirror gain is unity, a net current is supplied to output node 22 proportional to the difference between currents I1 and I2 (ignoring, for the moment, the effect of circuit offsets). The net current flow of output node 22 charges the nodal capacity thereby producing an output signal voltage S3 proportional to the difference between input signals S1 and S2 (again, ignoring for the moment the effect of offset).

The output signal S3 receives further amplification provided by an inverting amplifier 24 and the amplified output signal S4 is coupled to differential amplifier output terminal 26 by means of an output switch 28 when switch 28 is in the "amplify" position. During offset correction of amplifier 10 the gate electrodes of input transistors P1 and P2 are shorted by means of an input switch 32 and output switch 28 is placed in the "null" position (as shown) for supplying the amplifier output signal S4 to an external capacitor C1 via an terminal 30. The amplifier voltage, thus sampled and stored on capacitor C1 with the gates of the input transistors shorted is used in a subsequent amplifying cycle of amplifier 10 for providing offset correction as will be explained. Inverting amplifier 24 may be of conventional design (e.g., a common source connected N-channel transistor having a common source connected P-channel transistor biased to act as a constant current source load element) and may comprise one stage or it may comprise a number of cascaded stages.

Amplifier 10 includes two current sources comprising P-channel transistors P5 and P6 that are controlled by a common bias voltage source 34. Transistors P5 and P6 are connected at the source electrodes thereof to a positive supply terminal 40 for receiving a supply voltage +V and are connected at the gate electrodes thereof to receive a common bias voltage Vb provided by bias voltage source 34. Supply 34 may be of conventional design. Advantageously, no special precautions are needed for reduction of the noise level of supply 34 because noise present in the output currents I5 and I6 of transistors P5 and P6 appears a common mode component of currents applied to current mirror amplifier 16 and are thus rejected by the subtraction effect provided mirror output node 22.

The current I5 of transistor P5 is applied to the source electrodes of transistors P1 and P2 for developing the main signal currents I1 and I2 supplied to current mirror amplifier 16. The current I6 of transistor P6 is divided into two offset correction currents I3 and I4 by means of auxiliary transistors P3 and P4 and supplied to the input and output nodes 20 and 22 of mirror 16 for correcting offset errors in amplifier 10. Specifically, current I6 is applied to the source electrodes of transistors P3 and P4 via respective source degeneration resistors 42 and 44.

The common source connection of transistors P3 and P4 in combination with source degeneration resistors 42 and 44 results in highly linear differential current splitting for current I6 and suppresses any tendency for rectification noise components to occur as will be discussed. Transistor P3 is connected at the gate and drain electrodes thereof to terminal 30 and node 20. Transistor P4 is connected at the gate thereof to receive a reference voltage Vr (and associated noise component Vn) provided by a reference voltage supply 50 and is connected at the drain thereof to node 22.

Supply 50 is a low noise supply powered by supply voltages +V and −V but otherwise being independent of supply 34 and having a lower noise voltage component that produced by supply 34. This is desirable because the noise component of supply 50 does not appear as a common mode component to current mirror 16 and thus does not receive the rejection which mirror 16 provides for the noise components of I5 and I6. Low noise operation may be achieved in supply 50 by use of standard noise reduction techniques (e.g., minimizing the number of components, avoiding the use of Zener or avalanche diodes, using semiconductor devices of relatively large junction area, filtering, etc.).

In operation the input and output switches 32 and 28 are operated synchronously at a desired "chopping" frequency. When in the "amplify" position, input signals S1 and S2 are applied to input transistors P1 and P2 which supply differentially related output currents I1 and I2 to the input and output terminals of current mirror amplifier load circuit 16. The resultant output signal S3 receives further amplification by inverting amplifier 24 and is coupled to output terminal 26 by output switch 28.

During the "null" cycle of amplifier 10 the input switch 32 shorts the gate electrodes of input transistors P1 and P2 and the output switch stores the amplifier output signal as an offset correction voltage Vo on external capacitor C1. Transistors P3 and P4, operating as a linear differential voltage to differential current converter, compares the offset correction voltage Vo with the reference voltage provided by low noise supply 50 and applies offset correction currents I3 and I4 to the input and output nodes (20, 22) of current mirror amplifier load circuit 16 in a sense to decrease the difference in potential between the voltage stored on capacitor C1 and the reference voltage Vr of source 50.

Advantageously, no rectification of the noise component Vn accompanying reference voltage Vr can occur (as in the prior art arrangement) because transistors P3 and P4 are coupled in a linear differential current splitter configuration which, moreover, has enhanced linearity provided by source degeneration resistors 42 and 44. Additionally the noise component of the correction current I6 is rejected by mirror 16 as a common mode input as well as the noise component of current I5. Moreover, since currents I5 and I6 are controlled by the same voltage source, their noise components are correlated and thus subject to cancellation as common mode inputs to mirror 16. If current source transistors were separately biased the noise components would be uncorrelated and thus noise cancellation in mirror 16 would be degraded.

A further feature of the invention is that values of the offset correction voltage Vo and the reference voltage Vr may be selected to lie within a relatively wide range of values comprising substantial portion (e.g., three quarters or so) of the net supply voltage applied to the amplifier. The net supply voltage equals the difference between the positive (+V) and negative (−V) voltages applied to terminals 40 and 18, respectively. In the previously discussed prior art circuit the correction and reference voltages were restricted to a relatively narrow range of values because the correction transistors were connected as common source amplifiers to the negative supply rail which results in a fixed or invariant source electrode potential.

In the present invention transistors P3 and P4 are source coupled in a linear differential current splitter configuration and so the source electrodes potentials are not fixed but rather change with changes in the reference and control voltages thereby providing a wide operating range for these voltages. The maximum value of Vr and Vo is approximately equal to the positive supply voltage +V minus the sum of the threshold voltages of transistor P6 and transistors P3 or P4. The minimum value is determined mainly by the threshold voltages of N1/N2 and P3/P4. These threshold voltages can be set so that the minimum value of Vr and Vo is equal to the negative supply potential. Accordingly, the overall operating range of the correction and reference voltages thus comprises a substantial percentage of the supply voltage as previously noted and this percentage tends to increase with increases in supply voltage.

An advantage of the wide control and reference voltage supply range feature of the invention is that one may construct the reference voltage source 50 for optimum low noise performance without the constraint of being forced to design the source for a specific voltage near the negative supply rail as in the prior art.

There has been shown and described apparatus for correcting offset errors characteristic of the stages (P1-P2, 16, 24) of a differential amplifier (16) which additionally reduces output noise and offset attributable to a noise component (Vn) of a reference voltage source (50) used in generating offset correction signals (I1, I2) for the differential amplifier.

Various modifications may be made to the illustrated embodiment. For example the transistor types may be reversed and additional stages may be connected in cascade or cascode with existing stages. Although illustrated with positive and negative supplies, the amplifier may be used with only one polarity of supply voltage (positive or negative). One or more (or all) of the illustrated field effect transistors may be replaced by bipolar transistors with appropriate allowance for base bias current flow.

What is claimed is:

1. A differential amplifier, comprising:
   a pair of input transistors for receiving input signals to be amplified and providing first and second output currents to respective inputs of a load circuit for developing an output signal representative of a difference in said input signals; and
   a linear offset correction circuit coupled to said load circuit and comprising:
   a first source providing an offset correction voltage and a second source providing a reference voltage; and
   a pair of auxiliary transistors responsive to said reference and correction voltages for supplying third and fourth differentially related output currents to respective inputs of said load circuit for correcting offset errors of said amplifier.

2. A differential amplifier as recited in claim 1 said input transistors and said auxiliary transistors are coupled to respective current sources for developing said output currents; and
   said current sources are controlled by a common bias voltage source for causing a noise component of said common bias voltage to be present as a common mode component of said output currents of said input and auxiliary transistors.

3. A differential amplifier as recited in claim 2 wherein:
   said reference voltage source and said bias voltage source have independent output noise characteristics; and
   said reference voltage source having a lower noise component of output voltage than said bias voltage source.

4. A differential amplifier as recited in claim 1 wherein:
   said input transistors comprise field effect transistors having source electrodes directly coupled to a first current source; and
   said auxiliary transistors comprise field effect transistors having source electrodes coupled via respective impedances to a second current source; and
   said first and second current sources are controlled by a common bias voltage source.

5. A differential amplifier as recited in claim 4 wherein:
   said reference voltage source and said common bias voltage source have independent output noise characteristics; and
   said reference voltage source having a lower noise component of output voltage than said common bias voltage source.

6. A differential amplifier as recited in claim 1 wherein:
   said load circuit comprises a current mirror amplifier having input and output terminals; and
   said first and third currents are applied to said input terminal of said current mirror amplifier and said second and fourth currents are applied to said output terminal of said current mirror amplifier.

7. A differential amplifier as recited in claim 1 wherein said differential amplifier includes first and second supply voltage input terminals for receiving a supply voltage thereacross and said pair of auxiliary transistors are coupled via a current source to one of said supply terminals for producing said third and fourth differentially related output currents in response to a range of values of said reference and correction voltages which corresponds to a substantial portion of said supply voltage applied to said supply voltage input terminals.

8. A differential amplifier, comprising:
   a current mirror amplifier;
   a pair of input transistors coupled to supply first and second currents to respective input and output terminals of said current mirror amplifier;
   a source for providing a reference voltage and a node for providing a null voltage; and
   a pair of auxiliary transistors coupled to supply third and fourth currents to respective ones of said input and output terminals of said current mirror amplifier, said currents being inversely related one to another, each current varying as a linear function of a potential difference between said null voltage and said reference voltage for compensating said differential amplifier for offset errors.

9. A differential amplifier as recited in claim 8 wherein:
   said input transistors are coupled to a first current source;
   said auxiliary transistors are coupled to a second current source;
   and said current sources are controlled by a common bias voltage source.

10. A differential amplifier as recited in claim 8 wherein:
    said reference voltage source and said bias voltage source are independent sources; and
    said reference voltage source having a lower noise component of output voltage than said bias voltage source.

11. A differential amplifier as recited in claim 8 wherein
    said input transistors comprise field effect transistors having source electrodes directly coupled to a first current source; and said auxiliary transistors comprise field effect transistors having source electrodes coupled via respective impedances to a second current source.

12. A differential amplifier as recited in claim 11 wherein
    said auxiliary transistors are selected to be of lower transconductance than said input transistors; and
    said first and said current sources are controlled by a common bias voltage source.

13. A differential amplifier as recited in claim 12 wherein
    said reference voltage source and said bias voltage source have independent noise characteristics; and
    said reference voltage source exhibits a lower noise component of output voltage than said bias voltage source.

14. A differential amplifier as recited in claim 13 wherein
    said first and third currents are supplied in a given sense to said input terminal of said current mirror amplifier: and
    wherein said second and fourth currents are supplied in said given sense to said output terminal of said current mirror amplifier.

15. A differential amplifier as recited in claim 8 wherein said differential amplifier includes first and second supply voltage input terminals for receiving a supply voltage thereacross and said pair of auxiliary transistors are coupled via a current source to one of said supply terminals for producing said third and fourth currents in response to a range of values of said reference and null voltages which corresponds to a substantial portion of said supply voltage applied to said supply voltage input terminals.

* * * * *